United States Patent [19]
Osanai et al.

[11] Patent Number: 5,864,389
[45] Date of Patent: Jan. 26, 1999

[54] STAGE APPARATUS AND EXPOSURE APPARATUS AND DEVICE PRODUCING METHOD USING THE SAME

[75] Inventors: Eiji Osanai, Yokohama; Kotaro Akutsu, Soka, both of Japan

[73] Assignee: Canon Kabushiki Kaisha, Tokyo, Japan

[21] Appl. No.: 797,083

[22] Filed: Feb. 10, 1997

[30] Foreign Application Priority Data

Feb. 13, 1996 [JP] Japan .................................. 8-025124

[51] Int. Cl.$^6$ .................................................. G03B 27/42
[52] U.S. Cl. .............................. 355/53; 355/72; 359/393; 250/492.2
[58] Field of Search ........................ 355/53, 72; 356/399, 356/400, 401; 250/491.1, 492.2; 318/649, 625, 628, 632; 359/393

[56] References Cited

U.S. PATENT DOCUMENTS

| | | | |
|---|---|---|---|
| 4,766,465 | 8/1988 | Takahashi | 355/53 |
| 5,040,431 | 8/1991 | Sakino et al. | |
| 5,187,519 | 2/1993 | Takabayashi et al. | 355/53 |
| 5,260,580 | 11/1993 | Itoh et al. | 250/492.2 |
| 5,280,677 | 1/1994 | Kubo et al. | |
| 5,382,095 | 1/1995 | Akutsu | |
| 5,446,519 | 8/1995 | Makinouchi | 355/53 |
| 5,610,686 | 3/1997 | Osanai | 355/53 |
| 5,701,041 | 12/1997 | Akutsu et al. | 310/12 |
| 5,726,548 | 3/1998 | Chiba et al. | 318/625 |

Primary Examiner—A. A. Mathews
Attorney, Agent, or Firm—Fitzpatrick, Cella, Harper & Scinto

[57] ABSTRACT

A stage apparatus is provided with a table having a reference surface, support means for supporting the table, a first movable body movable in a first direction on the reference surface, first driving means for driving the first movable body, a second movable body movable in a second direction differing from the first direction with the first movable body as the reference, and second driving means for driving the second movable body, and the driving reaction forces of the first driving means and the second driving means are received by a base discrete from the table. Also, provision is made of a supporting mechanism for supporting the second driving means for minute displacement in the second direction relative to the first movable body. By this construction, the influence of a reaction force resulting from the acceleration and deceleration of the stage is made small.

39 Claims, 9 Drawing Sheets

STAGE APPARATUS AND EXPOSURE APPARATUS AND DEVICE PRODUCING METHOD USING THE SAME

BACKGROUND OF THE INVENTION

1. Field of the Invention

This invention relates to a stage apparatus for moving and positioning an object highly accurately which is suitable for various measuring apparatuses and a projection exposure apparatus or the like used in a semiconductor lithography process, and an exposure apparatus such as a step and repeat exposure apparatus and a device producing method using the same.

2. Related Background Art

Figure 10:
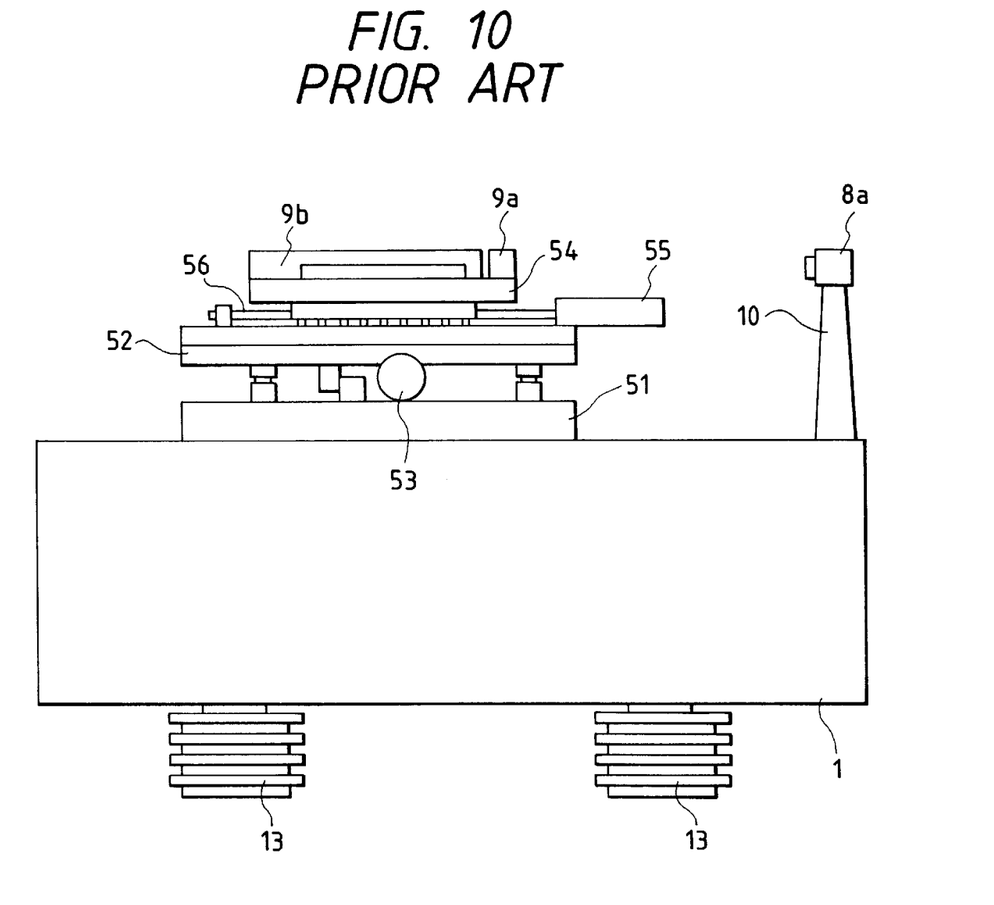
FIG. 10 shows the construction of an example of the conventional art.

FIG. 10 of the accompanying drawings shows an example of the construction of a stage apparatus according to the conventional art. In FIG. 10, the reference numeral 51 designates a stage base on which is placed a Y stage 52 as a moving mechanism in Y direction. The reference numeral 53 denotes a DC servo motor for converting rotative motion into linear motion by a ball screw and driving the Y stage 52, and the DC servo motor 53 is fixed to the stage base 51. The reference numeral 54 designates an X stage placed on the Y stage 52, and the reference numeral 55 denotes a DC servo motor for converting rotative motion into linear motion by a ball screw 56 and driving the X stage 54, and the DC servo motor 55 is fixed to the Y stage 52. The reference numeral 1 designates a table for holding the stage base 51. The reference characters 9a and 9b denote reflecting mirrors for a laser length measuring machine, and the reflecting mirrors 9a and 9b are fixed to the X stage 54. The reference character 8a designates the interferometer of the laser length measuring machine for detecting the position of the X stage 54 in X direction, and the interferometer 8a is fixed to the table 1 with a mounting stand 10 interposed therebetween. The reference numeral 13 denotes mount members for interrupting the transmission of vibration from a floor on which the apparatus is installed.

In the above-described construction, when the Y stage 52 and the X stage 54 are driven, the reaction force of an inertia force resulting from the acceleration and deceleration of a movable body is transmitted to the table 1. However, there has been the problem that when the support reaction force resulting from the acceleration and deceleration of the movable body is transmitted to the table 1, the natural vibration of a mechanism system supported by the mount members 13 is excited and disturbance vibration is transmitted to the X stage 54, the Y stage 52 and the laser interferometer 8a to thereby hamper rapid and highly accurate feeding.

SUMMARY OF THE INVENTION

In order to solve this problem, U.S. Pat. No. 5,260,580 proposes a stage apparatus designed such that the stationary element of a linear motor for driving a stage is supported independently of a stage table to thereby prevent any reaction force from being transmitted to the table.

It is an object of the present invention to provide an excellent apparatus evolved from the apparatus disclosed in the above-mentioned U.S. Pat. No. 5,260,580. Specifically, it is an object of the present invention to provide a stage apparatus in which the influence of a reaction force resulting from the acceleration and deceleration of a stage is made small to thereby achieve higher accuracy than in the conventional art, and a highly accurate exposure apparatus and a device producing method using such a stage apparatus.

One form of the stage apparatus of the present invention which achieves the above objects has a table having a reference surface, support means for supporting said table, a movable body movable on said reference surface, driving means for driving said movable body, and a base supporting said driving means and discrete from said table, and is characterized in that at least a portion of a guide member for guiding said movable body is fixed to said base. According to this, at least a portion of the guide member is secured to the base, whereby the driving reaction force of the driving means is supported by the base and therefore the table is not vibrated and thus, there can be provided a stage apparatus which is higher in accuracy than the conventional art.

Another form of the stage apparatus of the present invention is provided with a table having a reference surface, support means for supporting said table, a first movable body movable in a first direction on said reference surface, first driving means for driving said first movable body in the first direction, a second movable body movable in a second direction differing from said first direction with said first movable body as the reference, and second driving means for driving said second movable body in the second direction, and is characterized in that the driving reaction forces of said first driving means and said second driving means are received by a base discrete from said table. According to this, the driving reaction forces of the first driving means and the second driving means are both received by the base and therefore, even if the movable bodies are driven in any of the first and second directions, the driving reaction forces are not transmitted to the table and thus, there can be provided a two-dimentional stage apparatus which is higher in accuracy than the conventional art.

Another form of the stage apparatus of the present invention has a table having a reference surface, support means for supporting said table, a first movable body movable in a first direction on said reference surface, a second movable body movable in a second direction differing from said first direction with said first movable body as the reference, and driving means movable in the first direction with said first movable body and for driving said second movable body in the second direction, and is characterized in that provision is made of a supporting mechanism for supporting said driving means for minute displacement in said second direction relative to said first movable body. According to this, the fluctuation of the relative position of the table and a base can be absorbed by the supporting mechanism and therefore, there can be provided a two-dimensional stage apparatus which is higher in accuracy than the conventional art.

Also, the exposure apparatus of the present invention is characterized by any one of the above-described stage apparatuses for holding and positioning a substrate to the exposed, and exposure means for effecting exposure on said substrate to be exposed. It is more preferable that said exposure means be provided with the table of said stage as the reference.

Also, the device producing method of the present invention is characterized by the step of effecting exposure by the use of the above-described exposure apparatus.

Further objects and forms of the present invention will become apparent from the following description of some embodiments of the invention.

DESCRIPTION OF THE PREFERRED EMBODIMENTS

<Embodiment of an Exposure Apparatus>

Figure 1:
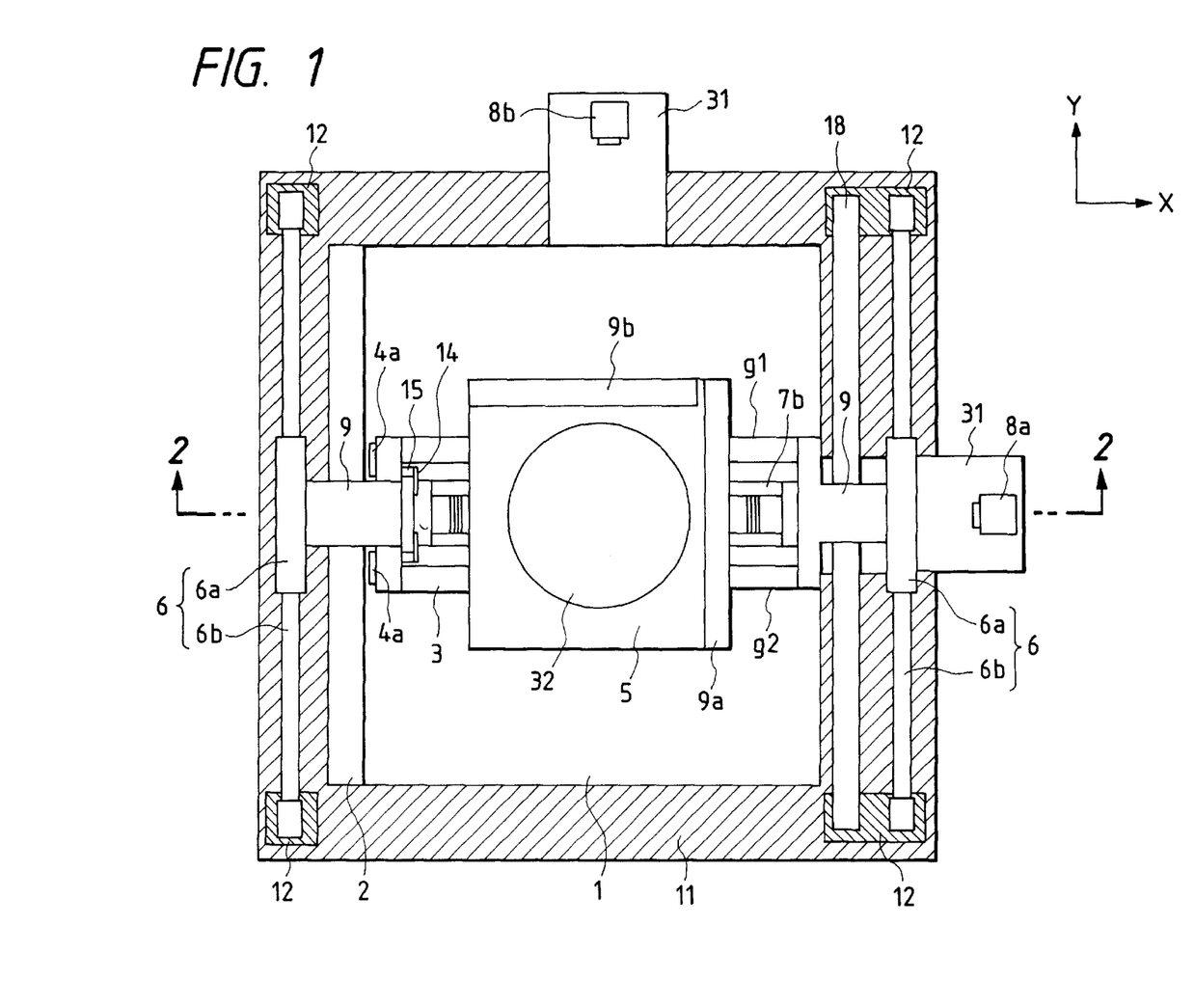
FIG. 1 is a plan view showing the construction of an embodiment of the present invention.
Figure 2:
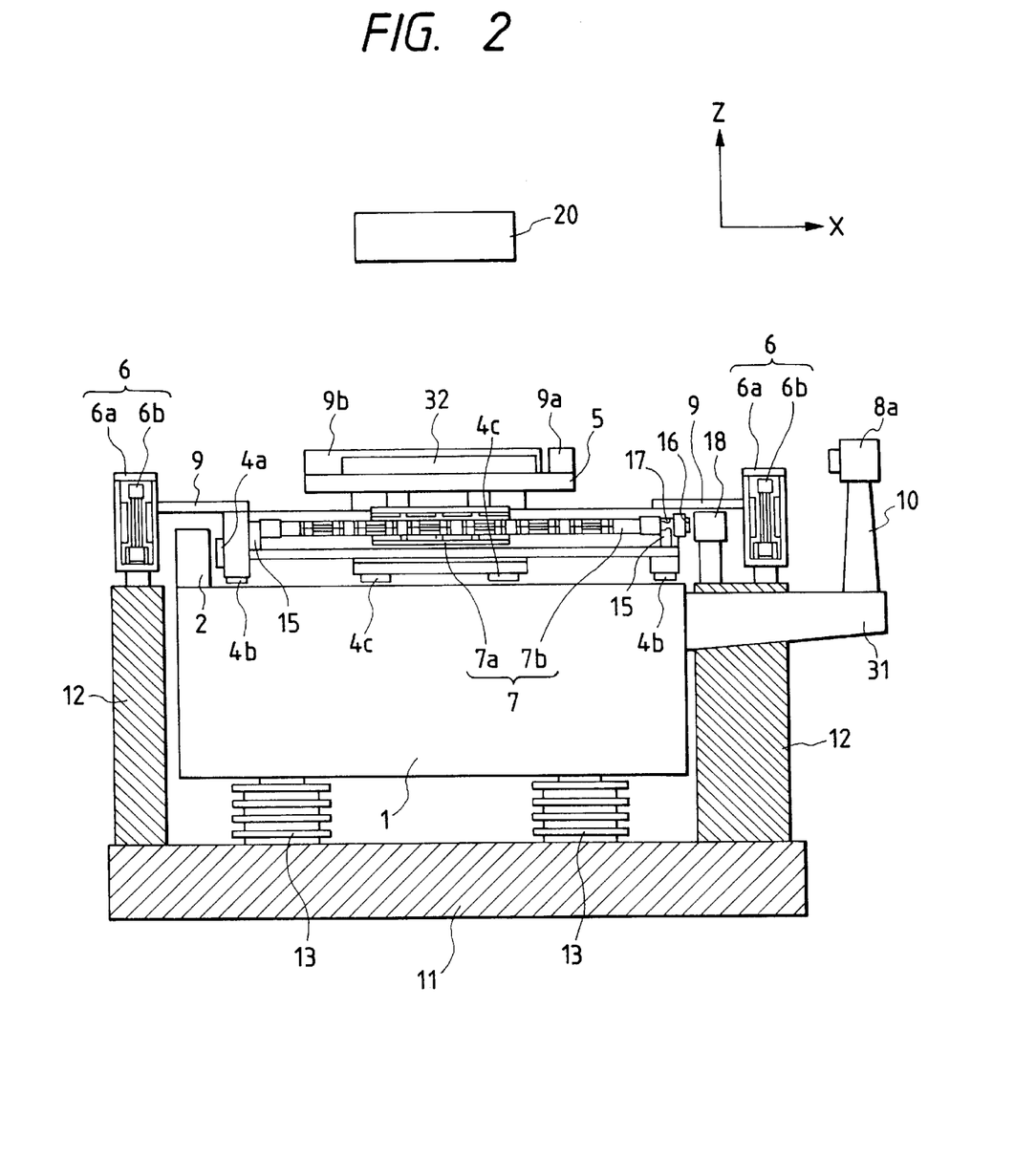
FIG. 2 is a cross-sectional view taken along the line 2—2 of FIG. 1.
Figure 3:
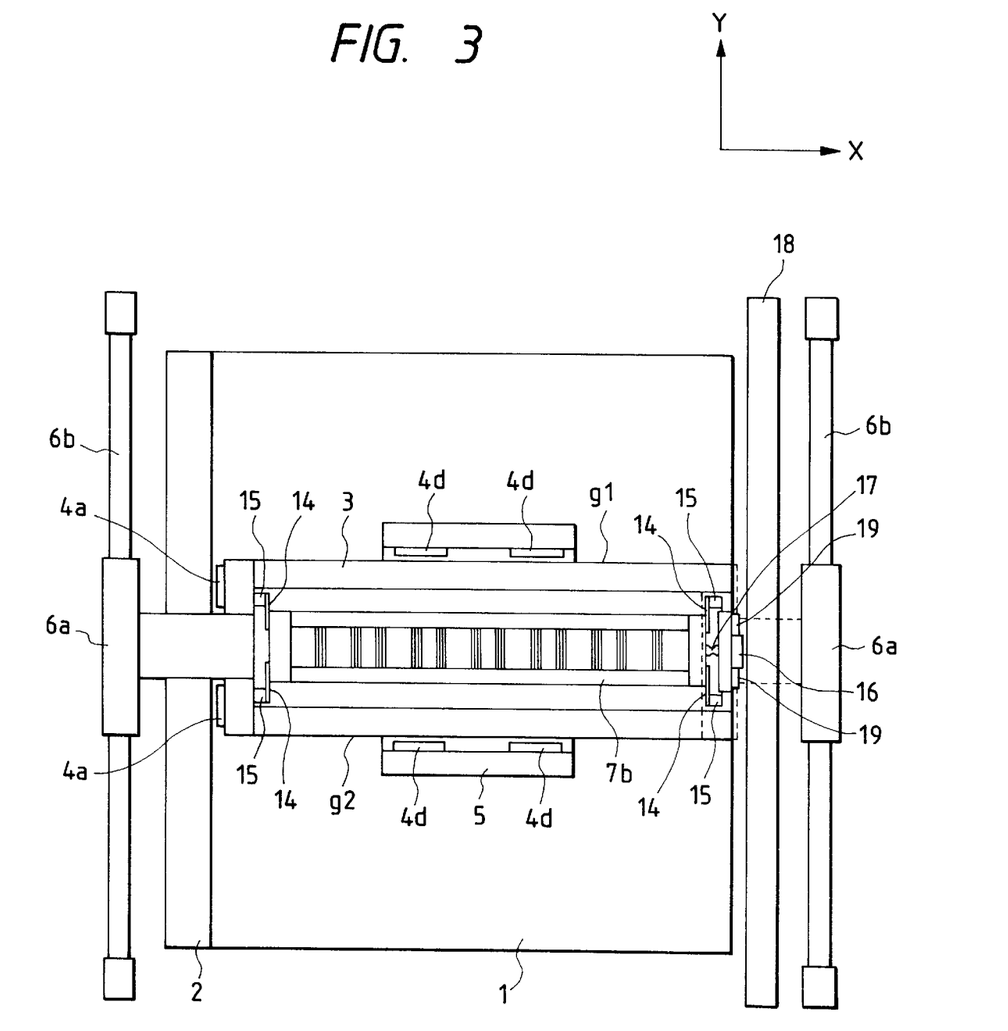
FIG. 3 is a plan view showing a portion of FIG. 1.

Description will hereinafter be made of an embodiment of an exposure apparatus having a stage apparatus. FIG. 1 is a plan view of the apparatus of the present invention, and FIG. 2 is a cross-sectional view taken along the line 2—2 of FIG. 1. FIG. 3 is a plan view of a portion of FIG. 1.

In these figures, the reference numeral 1 designates a table having a guide surface on top thereof. The reference numeral 2 denotes a fixed guide having a guide surface in a direction orthogonal to the guide surface of the table 1, and secured to the table 1. The reference numeral 3 designates a movable guide (a first movable body) having guide surfaces g1 and g2 in a direction orthogonal to the guide surface of the table 1, and supported and guided in non-contact with hydrostatic bearing pads 4a and 4b provided on the guide surfaces of the table 1 and fixed guide 2. The reference numeral 32 denotes a chuck for fixing a substrate to be exposed (a semiconductor wafer) by such means as vacuum adsorption, and the reference numeral 5 designates a movable stage (a second movable body) for holding the chuck 32. Also, hydrostatic bearing pads 4c are provided in opposed relationship with the guide surface of the table 1 and hydrostatic bearing pads 4d are provided in opposed relationship with the guide surfaces g1 and g2 of the movable guide 3 to thereby support and guide the table and the movable guide in non-contact. Prepressure is given to the hydrostatic bearing pads 4c and 4d by such means as magnet attraction and vacuum adsorption. The reference characters 9a and 9b denote reflecting mirrors for a laser length measuring machine, and the reflecting mirrors 9a and 9b are secured to the movable stage 5. The reference characters 8a and 8b designate the interferometers of the laser length measuring machine for detecting the position of the movable stage 5, and the interferometers 8a and 8b are fixed so as to be substantially integral with the table 1 through a mounting stand 10 and a mounting base 31. The interferometers 8a and 8b which are the measuring means of the movable stage 5 are provided with the table 1 as the reference so that even if the table 1 is displaced, the movement of the movable stage 5 can be measured accurately.

Also, as shown in FIG. 2, exposure means 20 including a projection optical system for exposing and transferring the pattern of a mask onto the substrate is provided above the movable stage 5. The exposure means 20 is provided with the table 1 as the reference so that relative displacement between the two may not take place due to a reaction force resulting from the driving of the stage so as to keep the positional relation between the projection optical system and the substrate to be exposed highly accurate.

The reference numeral 11 denotes a base for supporting the table 1 through a mount member 13 provided with a vibration removing mechanism for interrupting the transmission of vibration. The reference numeral 6 denotes two linear motors for driving the movable guide 3 in Y direction in non-contact therewith, and movable elements 6a are coupled to the opposite ends of the movable guide 3 through mounting plates 9, and stationary elements 6b are fixed to the base 11 through bases 12. The reference numeral 7 designates a linear motor for driving the movable stage 5 in X direction in non-contact therewith, and a movable element 7a is coupled to the movable stage 5 and a stationary element 7b is coupled to the movable guide 3 through four leaf springs 14. The reference numeral 18 denotes a fixed guide having a guide surface in a direction substantially orthogonal to the guide surface of the table 1 and formed of a magnetic material, and secured to the base 11 through the bases 12. That is, the fixed guide 18 is provided independently of the table 1 with the base 11 as the reference.

Figure 4:
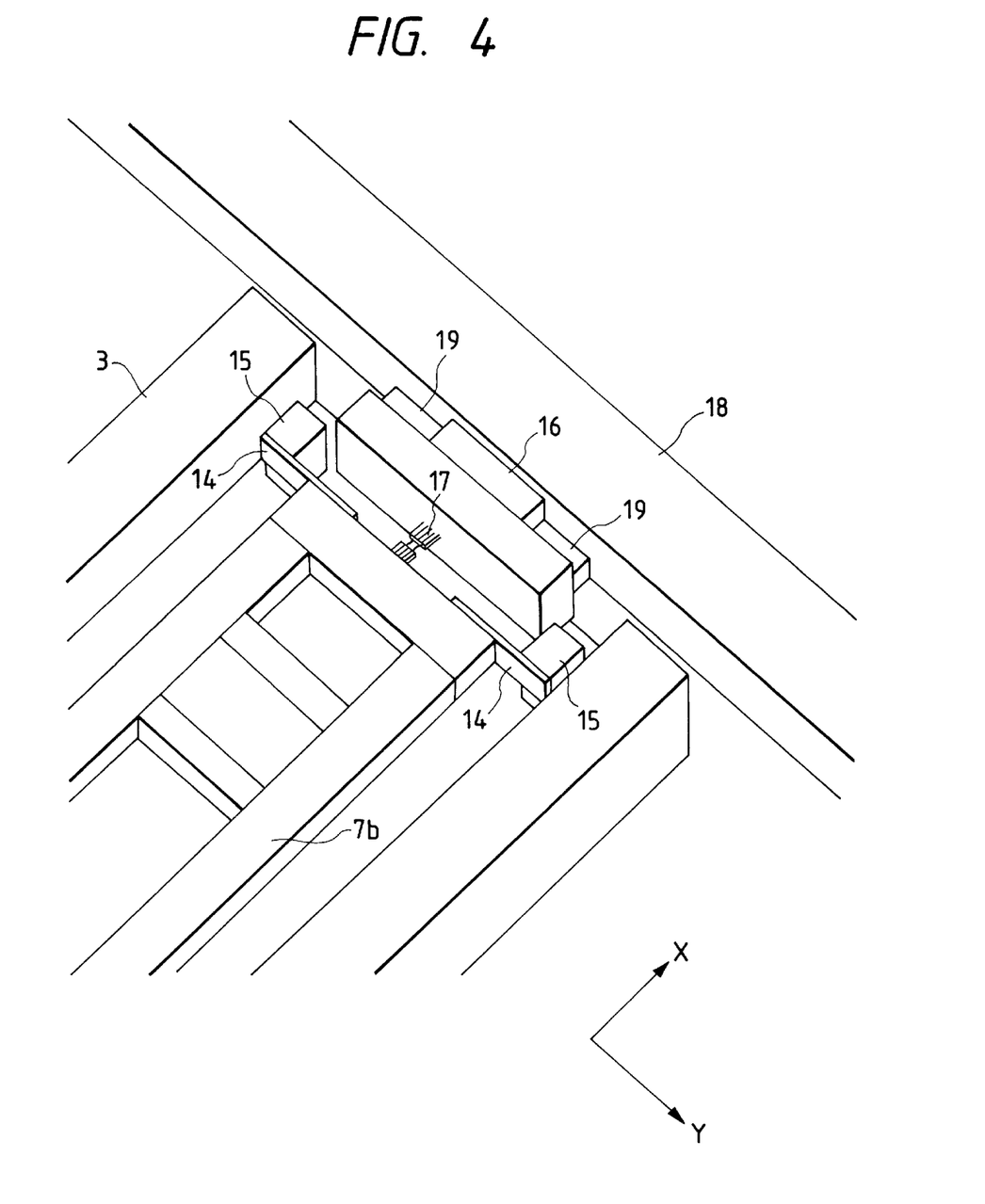
FIG. 4 is a fragmentary perspective view.

FIG. 4 is an enlarged view of a mechanism for mounting the stationary element 7b on the movable guide. The leaf springs 14 are fixed to a fixed member 15 having one end thereof provided on the stationary element 7b of the linear motor and having the other end thereof provided on the movable guide 3, and a similar leaf spring mechanism is also provided on the other end side of the linear motor 7, and four leaf springs in total are used. Thereby there is constructed a parallel moving mechanism for making the stationary element 7 minutely movable only in X direction relative to the movable guide 3. By this construction, the reaction force when the movable stage 5 is driven in X direction by the linear motor 7 is caused to escape by the leaf spring mechanism to thereby mitigate the transmission of the force to the movable guide 3.

Also, the reference numeral 16 designates a hydrostatic bearing pad for supporting the stationary element 7b in non-contact therewith, and this hydrostatic bearing pad 16 is disposed in opposed relationship with the guide surface of the fixed guide 18 and is coupled to the stationary element 7b through a hinge 17. The reference numeral 19 denotes a permanent magnet provided to give prepressure to the hydrostatic bearing pad 16. The hinge 17 has high rigidity in X direction, and is small in rigidity in Y direction as compared with X direction. The reaction force in X direction by the linear motor 7 is adapted to be supported by the guide 18 through the hinge 17 and the pad 16. That is, the guide 18 plays the role of a guide when the movable guide 3 is moved in Y direction and also plays the role of supporting the force in X direction by the driving of the linear motor 7. Accurate positioning is done with the fixed guide 2 as the reference.

Figure 5:
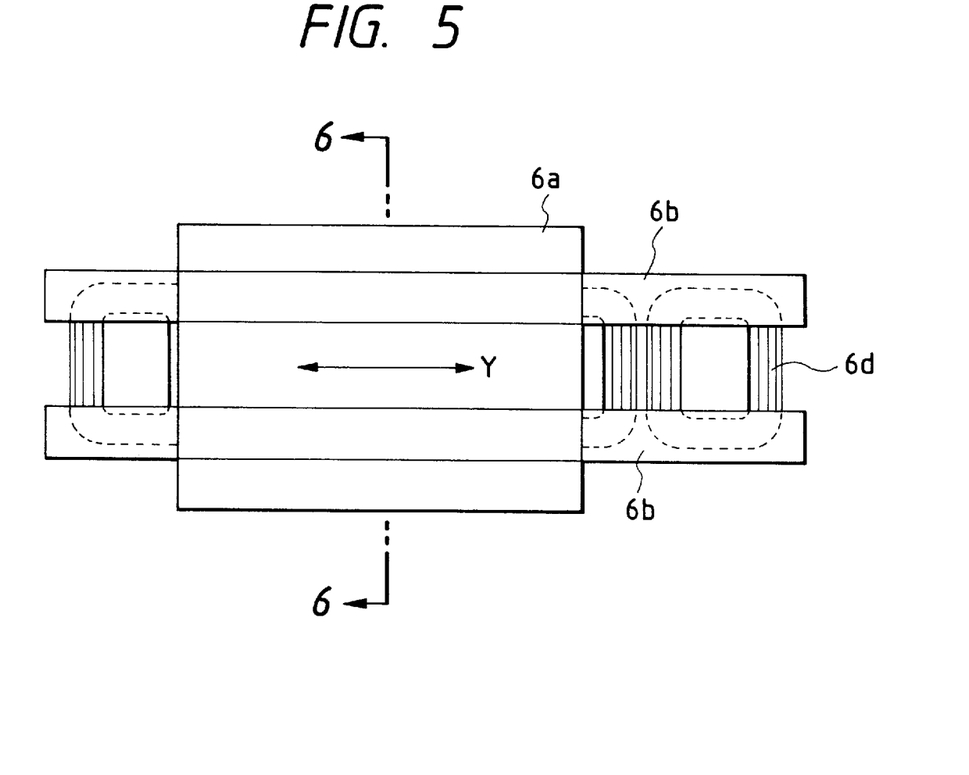
FIG. 5 is a fragmentary enlarged view.
Figure 6:
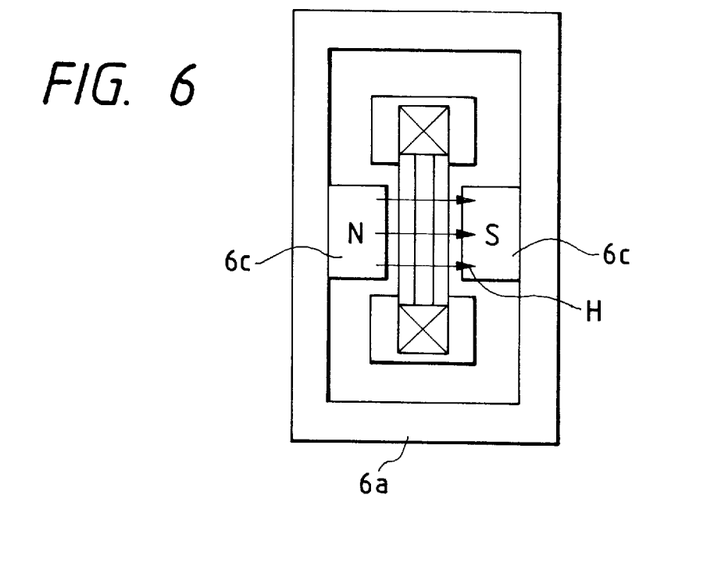
FIG. 6 is a cross-sectional view taken along the line 6—6 of FIG. 5.

FIG. 5 is a fragmentary enlarged view of the linear motor 6, and FIG. 6 is a cross-sectional view taken along the line 6—6 of FIG. 5. The linear motor is such that the movable elements 6a are formed of a magnetic material, and a set of permanent magnets 6c of which the N and S poles are opposed to each other are attached by adhesion to thereby provide a magnetic circuit which forms magnetic fluxes indicated by arrows H in FIG. 6. On the other hand, the stationary element 6b comprises a plurality of coils 6d arranged on a straight line and secured to one another, and the coils 6d are disposed so as to be located in a space to which the permanent magnets 6c of the movable element are opposed. The linear motor 7 is also similar in construction to the linear motor 6. The linear motors in the present embodiment each have a stationary element and a movable element and create thrust by Lorentz's force and multiple type linear motors are used as such linear motors.

Figure 7:
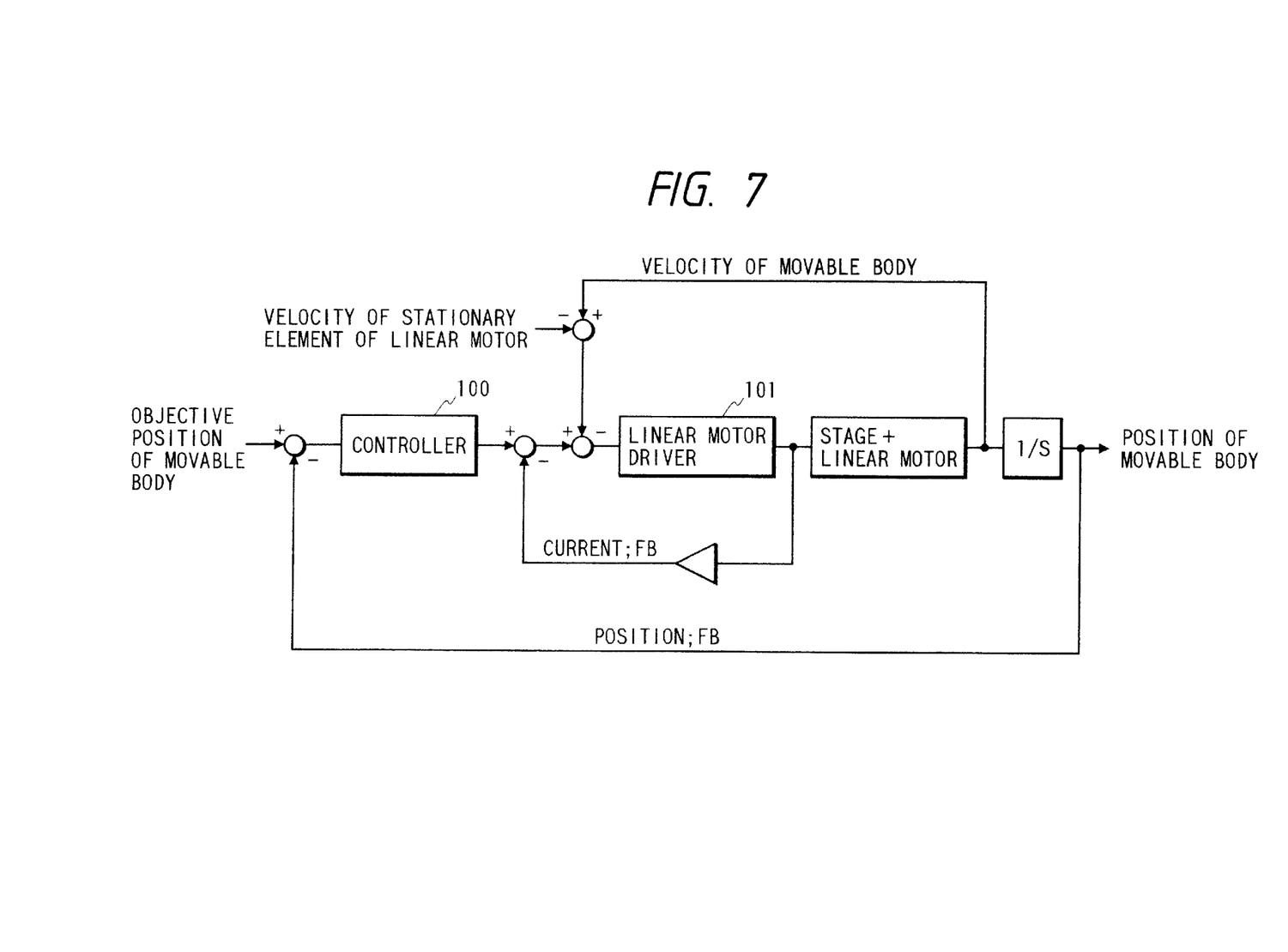
FIG. 7 is a block diagram of a control system.

FIG. 7 is a block diagram showing the drive control system of the apparatus of the present embodiment. In FIG. 7, the reference numeral 100 designates a controller for effecting the compensation of the driving of the movable stage 5, and the reference numeral 101 denotes a linear motor driver for supplying an electric current to the linear motor coils. Each coil is connected to the linear motor driver 101 to thereby drive the movable stage 5 in X and Y directions in conformity with the amount of electric current supplied thereto. The amount of electric current assumes a value conforming to the objective position deviation of the movable stage 5 by feeding back the output signal of the laser length measuring machine to the controller 100.

In the above-described construction, a predetermined command signal is inputted to the controller 100 to thereby drive the movable stage 5. At this time, the inertia force resulting from the acceleration and deceleration of the driving of the movable stage 5 in Y direction is transmitted as a reaction force in Y direction to the bases 12 through the stationary elements 6b of the linear motor, but this force is received by the base 11 and therefore, the reaction force is not transmitted to the table 1. Also, the inertia force resulting from the acceleration and deceleration of the driving of the movable stage 5 in X direction is transmitted as a reaction force in X direction to the stationary element 7b of the linear motor, and is transmitted to the bases 12 through the hinge 17, the hydrostatic bearing pad 16 and the fixed guide 18, but this force is received by the base 11 and therefore, the reaction force is not transmitted to the table 1. The reaction force excites the natural vibration of the base 11 and the bases 12, but the transmission of the vibration to the table 1 is interrupted by the mount members 13. Accordingly, in the movement in any of X and Y directions, the natural vibration of the mechanism system supported by the mount members 13 is not excited and disturbance vibration is not transmitted to the movable stage 5 and the laser interferometers 8a and 8b.

Also, when the stationary elements 6b of the linear motor vibrate in Y direction, an inductive voltage is created in the coils 6d, but since the linear motor driver 101 controls the amount of electric current flowing to the coils 6d to a value conforming to a command signal from the controller 100, the drive force transmitted to the movable elements 6a can be kept at a value conforming to the command signal. Also, the vibrations of the stationary elements 6b in the other directions than Y direction are not transmitted to the movable elements 6a because they are in non-contact with each other. Regarding the vibration of the fixed guide 12, only a vibration component in X direction is transmitted to the stationary element 7b of the linear motor 7 through the hydrostatic bearing pad 16 and the hinge 17, but as is the case with the linear motor 6, even if the stationary element 7b vibrates in X direction, the drive force transmitted to the movable element 7a can be kept at a value conforming to the command signal.

As described above, the reaction force of the inertia force resulting from the acceleration and deceleration of the movable stage 5 is supported by a base discrete from the table, whereby no force (inertia force) is transmitted to the table 1 supporting the movable stage 5 and the laser interferometers 8a and 8b, and the vibration of the base 11 is not transmitted to the movable stage 5 and therefore, there can be achieved a stage apparatus in which it is possible to make the excitation of various natural vibrations which provide disturbance vibration small and rapid and highly accurate positioning is possible.

In the above-described construction, the stationary element 7b of the linear motor 7 is mounted on the movable guide 3 by the use of a one-shaft resilient guide mechanism comprised of the four leaf springs 14, but in the case of a construction movable only in X direction, the stationary element 7b may be mounted by the use of other system such as hydrostatic guide or antifriction or sliding guide to obtain an equal effect. The hydrostatic guide supports the stationary element 7b in non-contact (frictionlessly) and therefore, the vibration of the stationary element 7b in X direction is not at all transmitted to the movable guide 3 and it becomes easy to interrupt disturbance vibration. Also, the antifriction or sliding guide makes frictional resistance small, whereby it is sufficiently possible to interrupt the vibration of the stationary element 7b in X direction transmitted to the movable guide 3, and costs can be minimized by a simple construction.

Also, hydrostatic bearings are used for the guide system of the movable guide 3 and movable stage 5, but even in the case of other system such as antifriction or sliding bearing in which a fluctuating force such as friction resulting from the movement of the movable stage 5 is suppressed sufficiently the inertia force resulting from the movement of the movable stage 5 is not transmitted to the table 1 and it is possible to prevent the vibration of the base 11 from being transmitted to the movable stage 5, and the costs of the apparatus can be suppressed by a simple construction.

Further, it is also possible to construct the mount members 13 interrupting the transmission of vibration of a servo-mount (so-called active damper) having a levelling function in the supporting direction. The table 1 somewhat receives a moment inertial force about each axis (x-, y- and z-axes) through the movable guide 3 and the guide portion of the movable stage 5 with the movement of the movable stage 5, and creates some vibration relative to the base 11, but this vibration can be suppressed by the servo-mount and the position thereof relative to the base 11 can always be kept constant.

<Embodiment of a Device Producing Method>

Description will now be made of an embodiment of a device producing method utilizing the exposure apparatus described above.

Figure 8:
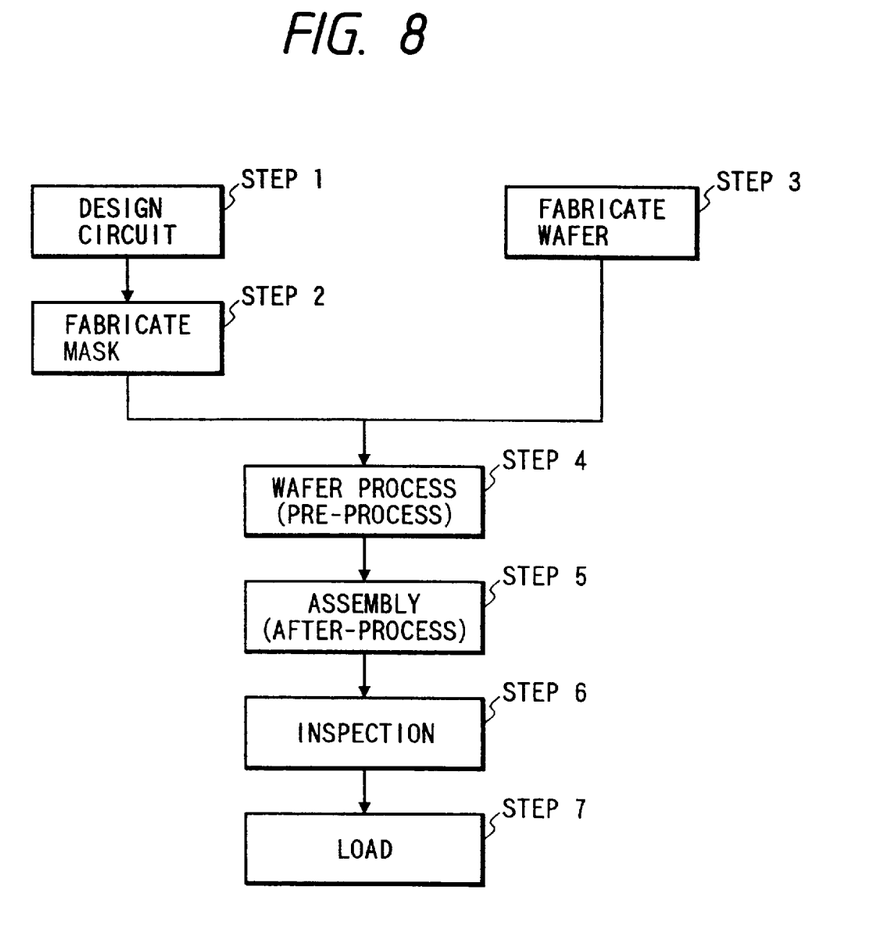
FIG. 8 is a chart showing the flow of a device producing method (i.e., semiconductor device manufacturing flow).

FIG. 8 shows the flow of the manufacture of a minute device (such as a semiconductor chip such as an IC or an LSI, a liquid crystal panel, a CCD, a thin film magnetic head, a micromachine or the like). At a step 1 (circuit design), the circuit of a semiconductor device is designed. At a step 2 (mask fabrication), a mask formed with the designed circuit pattern is fabricated. On the other hand, at a step 3 (wafer fabrication), a wafer is fabricated by the use of a material such as silicon. A step 4 (wafer process) is called a pre-process, in which an actual circuit is formed on the wafer by the lithography art by the use of the mask and wafer prepared as described above. The next step 5 (assembly) is called an after-process which is a process in which a semiconductor chip is made by the use of the wafer fabricated by the step 4, and includes the assembly step (dicing and bonding), the packaging step (enveloping the chip), etc. At a step 6 (inspection), inspections such as the operation confirmation test and durability test of the semiconductor device fabricated at the step 5 are effected. The semiconductor device is completed via such processes, and it is loaded (step 7).

Figure 9:
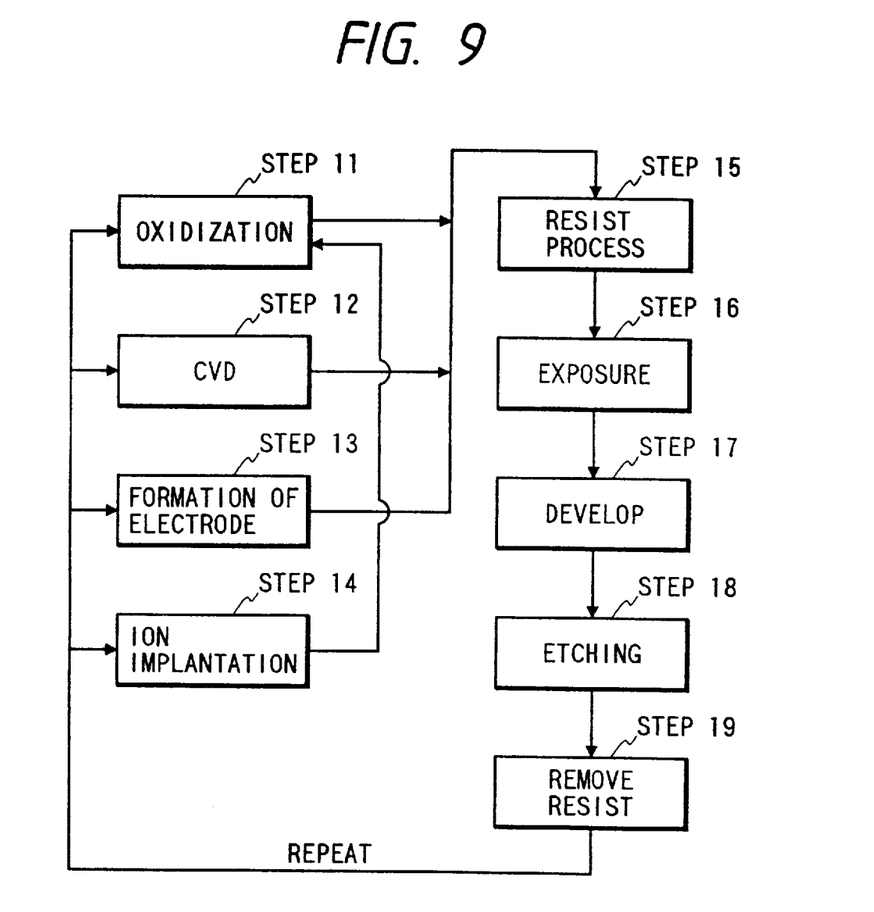
FIG. 9 is a chart showing the detailed flow of a wafer process.

FIG. 9 shows the detailed flow of the above-described wafer process. At a step 11 (oxidization), the surface of the wafer is oxidized. At a step 12 (CVD), insulating film is formed on the surface of the wafer. At a step 13 (formation of electrode), an electrode is formed by evaporation on the wafer. At a step 14 (ion implantation), ions are implanted into the wafer. At a step 15 (resist process), a photosensitive agent is applied to the wafer. At a step 16 (exposure), the circuit pattern of the mask is printed and exposed onto the wafer by the above-described exposure apparatus. At a step 17 (develop), the exposed wafer is developed. At a step 18 (etching), the other portions than the developed resist image are scraped off. At a step 19 (remove resist), the resist which has become unnecessary after the etching is removed. By these steps being repeatedly executed, circuit patterns are multiplexly formed on the wafer.

The use of the manufacturing method of the present embodiment can manufacture a semiconductor device of high degree of integration which has heretofore been difficult to manufacture at low costs.

What is claimed is:

1. A stage apparatus comprising:
   a table having a reference surface;
   a movable body movable on the reference surface;
   a linear motor, having a stationary portion and a movable portion, for driving said movable body in a predetermined direction parallel to the reference surface;
   a base for supporting said stationary portion of said linear motor independently from said table with respect to vibrations;
   a mount for supporting said table so as to reduce vibrations transmitted between said base and said table;
   a first guide member fixed to said base having a guide surface perpendicular to the reference surface, for supporting said movable body; and
   a second guide member fixed to said table, for guiding said movable body along the predetermined direction.

2. A stage apparatus according to claim 1, further comprising measuring means for measuring the movement of said movable body, at least a portion of said measuring means being provided substantially integrally with said table.

3. A stage apparatus according to claim 2, wherein said measuring means comprises a laser interferometer, the body of said laser interferometer being provided substantially integrally with said table, and wherein an interferometer mirror is provided integrally with said movable body.

4. A stage apparatus according to claim 1, wherein said movable body is supported and guided with a hydrostatic bearing.

5. A stage apparatus according to claim 4, wherein said movable body is supported on said table with said hydrostatic bearing.

6. A stage apparatus according to claim 1, wherein reaction forces in a direction differing from the predetermined direction are received by said base.

7. A stage apparatus according to claim 6, wherein the reaction forces in a direction differing from the predetermined direction are transmitted to said base through said first guide member.

8. A stage apparatus according to claim 1, wherein said mount comprises a servo-mount mechanism.

9. An exposure apparatus having the stage apparatus of claim 1 for holding and positioning a substrate to be exposed, and exposure means for effecting exposure on said substrate to be exposed.

10. An exposure apparatus according to claim 9, wherein said exposure means is provided with the table of said stage as the reference.

11. An exposure apparatus having the stage apparatus of claim 2 for holding and positioning a substrate to be exposed, and exposure means for effecting exposure on said substrate to be exposed.

12. An exposure apparatus according to claim 11, wherein said exposure means is provided with the table of said stage as the reference.

13. An exposure apparatus having the stage apparatus of claim 3 for holding and positioning a substrate to be exposed, and exposure means for effecting exposure on said substrate to be exposed.

14. An exposure apparatus according to claim 13, wherein said exposure means is provided with the table of said stage as the reference.

15. A stage apparatus comprising:
    a table having a reference surface;
    a base provided independently from said table with respect to vibrations;
    a mount for supporting said table so as to reduce vibrations transmitted between said base and said table;
    a first movable body movable in a first direction parallel to the reference surface, the first movable body having a guide surface;
    a first linear motor, having a first stationary portion and a first movable portion coupled to said first movable body, for moving said first movable body in the first direction;
    a second movable body movable in a second direction perpendicular to the first direction, said second movable body being guided by the guide surface of said first movable body;
    a second linear motor, having a second stationary portion coupled to said first movable body and a second movable portion coupled to said second movable body, for moving said second movable body in the second direction; and
    a guide member fixed to said base for supporting said second stationary portion of said second linear motor, wherein at least a driving reaction force of said second linear motor is received by said base through said guide member.

16. A stage apparatus according to claim 15, further comprising a bearing pad located between said second stationary portion and said guide member, and a hinge for coupling said bearing pad and said second stationary portion together.

17. A stage apparatus according to claim 15, further comprising measuring means for measuring the movement of said first and second movable bodies, at least a portion of said measuring means being provided substantially integrally with said table.

18. A stage apparatus according to claim 17, wherein said measuring means comprises a laser interferometer, the body of said laser interferometer being provided substantially integrally with said table, and an interferometer mirror is provided integrally with said first and second movable bodies.

19. A stage apparatus according to claim 15, wherein said second stationary portion is coupled to said guide member through a bearing pad.

20. A stage apparatus according to claim 15, further comprising a supporting mechanism for supporting said second stationary portion so that said second stationary portion is displaceable in the second direction relative to said first movable body.

21. A stage apparatus according to claim 15, further comprising a hydrostatic bearing for supporting said second movable body on the reference surface.

22. A stage apparatus according to claim 15, wherein said first stationary portion is fixed to said base, and a driving reaction force of said first linear motor is received by said base.

23. A stage apparatus according to claim 15, wherein said mount comprises a servo-mount mechanism.

24. A stage apparatus comprising:
a table having a reference surface;
a base provided independently from said table with respect to vibrations;
a mount for supporting said table so as to reduce transmission of vibrations between said base and said table;
a first movable body movable in a first direction parallel to the reference surface, the first movable body having a guide surface;
a first linear motor, having a first stationary portion and a first movable portion coupled to said first movable body, for moving said first movable body in the first direction;
a second movable body movable in a second direction perpendicular to the first direction, said second movable body being guided by the guide surface of said first movable body;
a second linear motor, having a second stationary portion and a second movable portion coupled to said second movable body, for moving said second movable body in the second direction; and
a supporting mechanism for supporting said second stationary portion so that said second stationary portion is displaceable in the second direction relative to said first movable body.

25. A stage apparatus according to claim 24, wherein said supporting mechanism comprises any one of a spring mechanism, a hydrostatic guide mechanism, an antifriction guide mechanism, and a sliding guide mechanism.

26. A stage apparatus according to claim 24, further comprising a guide member fixed to said base, and a bearing pad located between said second stationary portion and said guide member, and a hinge mechanism for coupling said bearing pad and said second stationary portion together.

27. A stage apparatus according to claim 24, further comprising measuring means for measuring the movement of said first and second movable bodies, at least a portion of said measuring means being provided substantially integrally with said table.

28. A stage apparatus according to claim 27, wherein said measuring means comprises a laser interferometer, the body of said laser interferometer being provided substantially integrally with said table, and an interferometer mirror is provided integrally with said first and second movable bodies.

29. A stage apparatus according to claim 24, further comprising a guide member fixed to said base, wherein said second stationary portion is coupled to said guide member through a bearing pad.

30. A stage apparatus according to claim 29, wherein a driving reaction force in the second direction by said second linear motor is supported by said base.

31. A stage apparatus according to claim 24, further comprising a hydrostatic bearing for supporting said second movable body on the reference surface.

32. A stage apparatus according to claim 24, wherein said first stationary portion is fixed to said base, and a driving reaction force of said first linear motor is received by said base.

33. A stage apparatus according to claim 24, wherein said mount comprises a servo-mount mechanism.

34. A method of producing a device, the method comprising the steps of:
(a) providing an exposure apparatus comprising (i) a stage apparatus comprising:
a table having a reference surface;
a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body; and
a second guide member fixed to the table, for guiding the movable body along the predetermined direction, the stage apparatus holding and positioning a substrate to be exposed; and (ii) exposure means for effecting exposure on the substrate to be exposed; and
(b) effecting exposure by the use of the exposure apparatus.

35. A method of producing a device, the method comprising the steps of:
(a) providing an exposure apparatus comprising (i) a stage apparatus comprising:
a table having a reference surface;
a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body; and
a second guide member fixed to the table, for guiding the movable body along the predetermined direction, the stage apparatus holding and positioning a substrate to be exposed; and (ii) exposure means for effecting exposure on the substrate to be exposed, wherein the exposure means is provided with the table of the stage apparatus as a reference; and
(b) effecting exposure by the use of the exposure apparatus.

36. A method of producing a device, the method comprising the steps of:
(a) providing an exposure apparatus comprising (i) a stage apparatus comprising:
a table having a reference surface;

a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body;
a second guide member fixed to the table, for guiding the movable body along the predetermined direction; and
measuring means for measuring the movement of the movable body, at least a portion of the measuring means being provided substantially integrally with the table, the stage apparatus holding and positioning a substrate to be exposed; and (ii) exposure means for effecting exposure on the substrate to be exposed; and (b) effecting exposure by the use of the exposure apparatus.

37. A method of producing a device, the method comprising the steps of:

(a) providing an exposure apparatus comprising (i) a stage apparatus comprising:
a table having a reference surface;
a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body;
a second guide member fixed to the table, for guiding the movable body along the predetermined direction; and
measuring means for measuring the movement of the movable body, at least a portion of the measuring means being provided substantially integrally with the table, the stage apparatus holding and positioning a substrate to be exposed; and (ii) exposure means for effecting exposure on the substrate to be exposed, wherein the exposure means is provided with the table of the stage apparatus as a reference; and (b) effecting exposure by the use of the exposure apparatus.

38. A method of producing a device, the method comprising the steps of:

(a) providing an exposure apparatus comprising (i) a stage apparatus comprising:
a table having a reference surface;
a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body;
a second guide member fixed to the table, for guiding the movable body along the predetermined direction; and
measuring means for measuring the movement of the movable body, at least a portion of the measuring means being provided substantially integrally with the table;
wherein the measuring means comprises a laser interferometer, the body of the laser interferometer being provided substantially integrally with the table, and wherein an interferometer mirror is provided integrally with the movable body, the stage apparatus holding and positioning a substrate to be exposed; and (ii) exposure means for effecting exposure on the substrate to be exposed; and (b) effecting exposure by the use of the exposure apparatus.

39. A method of producing a device, the method comprising the steps of:

(a) providing an exposure apparatus comprising (i) a stage apparatus comprising:
a table having a reference surface;
a movable body movable on the reference surface;
a linear motor, having a stationary portion and a movable portion, for driving the movable body in a predetermined direction parallel to the reference surface;
a base supporting the stationary portion of the linear motor independently from the table with respect to vibrations;
a mount for supporting the table so as to reduce vibrations transmitted between the base and the table;
a first guide member fixed to the base having a guide surface perpendicular to the reference surface, for supporting the movable body;
a second guide member fixed to the table, for guiding the movable body along the predetermined direction; and
measuring means for measuring the movement of the movable body, at least a portion of the measuring means being provided substantially integrally with the table;
wherein the measuring means comprises a laser interferometer, the body of the laser interferometer being provided substantially integrally with the table, and wherein an interferometer mirror is provided integrally with the movable body, the stage apparatus holding and positioning a substrate to be exposed; and (ii) exposure means for effecting exposure on the substrate to be exposed, wherein the exposure means is provided with the table of the stage apparatus as a reference; and (b) effecting exposure by the use of the exposure apparatus.

* * * * *